United States Patent
Hirose (10) Patent No.: US 10,153,264 B2
(45) Date of Patent: Dec. 11, 2018

(54) STATIC RANDOM ACCESS MEMORY (SRAM) CELL INCLUDING FIN-TYPE TRANSISTOR

(71) Applicant: SOCIONEXT INC., Kanagawa (JP)

(72) Inventor: Masanobu Hirose, Kameoka (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/653,084

(22) Filed: Jul. 18, 2017

(65) Prior Publication Data

US 2017/0317065 A1 Nov. 2, 2017

Related U.S. Application Data

(63) Continuation of application No. PCT/JP2016/000052, filed on Jan. 7, 2016.

(30) Foreign Application Priority Data

Jan. 19, 2015 (JP) .................. 2015-007601

(51) Int. Cl.
| | |
|---|---|
| H01L 27/02 | (2006.01) |
| G11C 11/418 | (2006.01) |
| H01L 23/522 | (2006.01) |
| H01L 23/528 | (2006.01) |
| H01L 27/092 | (2006.01) |
| H01L 27/11 | (2006.01) |

(52) U.S. Cl.
CPC ........ *H01L 27/0207* (2013.01); *G11C 11/418* (2013.01); *H01L 23/5226* (2013.01); *H01L 23/5286* (2013.01); *H01L 27/0924* (2013.01); *H01L 27/1104* (2013.01); *H01L 27/1116* (2013.01)

(58) Field of Classification Search
None
See application file for complete search history.

(56) References Cited

U.S. PATENT DOCUMENTS

| | | | |
|---|---|---|---|
| 6,436,753 B1 | 8/2002 | Ikeda et al. | |
| 2002/0155657 A1 | 10/2002 | Ikeda et al. | |

(Continued)

FOREIGN PATENT DOCUMENTS

| | | |
|---|---|---|
| JP | 2000-058675 A | 2/2000 |
| JP | 2007-201107 A | 8/2007 |

(Continued)

OTHER PUBLICATIONS

Goto, Hiroshi, "Process Module Technologies for Next Generation CMOS Logis LSIs", Fujitsu 49, 2, pp. 152-155 (Mar. 1998); with English abstract.

(Continued)

*Primary Examiner* — Daniel Whalen
(74) *Attorney, Agent, or Firm* — McDermott Will & Emery LLP (57) ABSTRACT

The present disclosure allows for reducing parasitic capacitance of a bit line, and a drop in access performance in an SRAM cell including fin-type transistors. The SRAM cell is defined by transistors each of which has a fin structure and by a local metal interconnection layer. Bit lines are formed on the local metal interconnection layer, and diffusion layer contacts corresponding to bit line nodes are connected through vias to the bit lines.

11 Claims, 7 Drawing Sheets

(56) References Cited

U.S. PATENT DOCUMENTS

| | | |
|---|---|---|
| 2003/0153147 A1 | 8/2003 | Ikeda et al. |
| 2004/0191991 A1 | 9/2004 | Ikeda et al. |
| 2007/0189060 A1 | 8/2007 | Inaba |
| 2008/0198641 A1 | 8/2008 | Takahashi |
| 2010/0213514 A1 | 8/2010 | Liaw |
| 2013/0164931 A1 | 6/2013 | Liaw |
| 2013/0258759 A1 | 10/2013 | Liaw |
| 2015/0248521 A1 | 9/2015 | Liaw |
| 2016/0181257 A1* | 6/2016 | Liaw .................. H01L 27/0207 257/401 |

FOREIGN PATENT DOCUMENTS

| | | |
|---|---|---|
| JP | 2008-205092 A | 9/2008 |
| JP | 2010-166102 A | 7/2010 |
| JP | 2010-199575 A | 9/2010 |

OTHER PUBLICATIONS

International Search Report issued in International Patent Application No. PCT/JP2016/000052, dated Mar. 8, 2016; with partial English translation.
ISA's Written Opinion issued in International Patent Application No. PCT/JP2016/000052, dated Feb. 29, 2016; with partial English translation.

* cited by examiner

STATIC RANDOM ACCESS MEMORY (SRAM) CELL INCLUDING FIN-TYPE TRANSISTOR

CROSS-REFERENCE TO RELATED APPLICATION

This is a continuation of International Application No. PCT/JP2016/000052 filed on Jan. 7, 2016, which claims priority to Japanese Patent Application No. 2015-007601 filed on Jan. 19, 2015. The entire disclosures of these applications are incorporated by reference herein.

BACKGROUND

The present disclosure relates to a semiconductor integrated circuit device provided with an SRAM (static random access memory) cell including a transistor with a fin structure.

The increasing miniaturization of LSIs has lead to significant changes in transistor structures. Specifically, instead of planar-type transistors which have been a major trend in the past, recently, transistors with a three-dimensional (3D) structure have increasingly come to be used. A representative example of a 3D transistor is a transistor with a fin structure (hereinafter referred to as a fin-type transistor).

Figure 7:
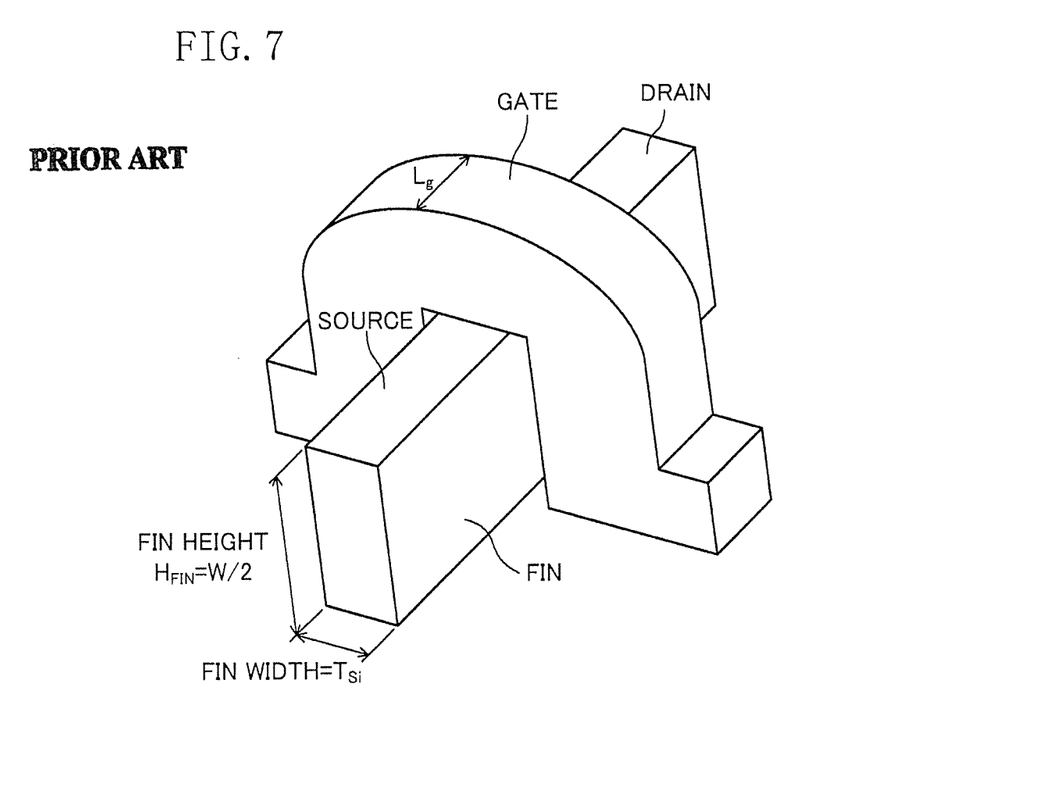
FIG. 7 schematically illustrates an outline of a transistor with a fin structure.

FIG. 7 schematically illustrates an outline of a fin-type transistor. Unlike a MOS transistor with its two-dimensional structure, a fin-type transistor has a source and a drain with a three-dimensional structure that rises up vertically and is referred to as a fin. Moreover, the fin-type transistor has a gate which is arranged so as to wrap around the fin. In this fin structure, a channel region is defined by three surfaces of the fin. This leads to a significantly improved channel controllability as compared to conventional structures. As a result, various advantages, including reduced leakage power, increased ON-state current, and lowered operating voltage, are achieved. This improves the performance of semiconductor integrated circuits.

One type of memory circuits employed in LSIs are SRAM (static random access memory) circuits. A structure of an SRAM cell using a fin-type transistor is disclosed in United States Patent No. 2013/0258759.

SUMMARY

A three-dimensional structure of a transistor increases a parasitic capacitance in the transistor. For example, while in a planar-type transistor a contact with respect to a diffusion region (diffusion region contact) is a contact hole, in a fin-type transistor the contact hole is replaced by a contact having an interconnection structure. That is, a dot-like shape of the contact is replaced by a linear shape. As a result, fin-type transistors have a higher capacitance between the diffusion region and a gate and a higher capacitance between the diffusion region and an STI (shallow trench isolation) than planar-type transistors. Moreover, since in a fin-type transistor a gate electrode wraps around the fin which rises up vertically, fin-type transistors need to be formed thicker than planar-type transistors. As a result, the parasitic capacitance of the gate electrode increases.

In the layout structure of the SRAM cell disclosed in United States Patent No. 2013/0258759 (FIGS. 5 to 7), a bit line is formed on a second metal interconnection layer (see FIG. 7 in United States Patent No. 2013/0258759). Therefore a signal path from the transistor to the bit line runs through an interconnection of a first metal interconnection layer and vias between the first metal interconnection layer and the second metal interconnection layer. Thus, parasitic capacitances of the interconnection and the vias add up to a parasitic capacitance of the bit line. In addition, because of the above-mentioned high parasitic capacitance of the fin-type transistor, in the structure of United States Patent No. 2013/0258759, the parasitic capacitance of the bit line increases and the risk of an access performance sufficient for an SRAM cell failing to be achieved is high.

The present disclosure relates to an SRAM cell including a fin-type transistor, and attempts to reduce parasitic capacitance of a bit line and a drop in the access performance.

According to an aspect of the present disclosure, a semiconductor integrated circuit device includes:

at least one SRAM (static random access memory) cell;

a first metal interconnection layer formed as an upper layer of the SRAM cell;

a local metal interconnection layer formed as an upper layer of the SRAM cell and below the first metal interconnection layer, and being thinner than the first metal interconnection layer;

and a contact layer formed below the local metal interconnection layer, the SRAM cell including:

a first inverter which has an output terminal connected to a first memory node and includes a first pull up transistor provided between a first high-potential power node and the first memory node, and a first pull down transistor provided between a first low-potential power node and the first memory node, gates of the first pull up transistor and the first pull down transistor being commonly connected to a second memory node;

a second inverter which has an output terminal connected to the second memory node and includes a second pull up transistor provided between a second high-potential power node and the second memory node, and a second pull down transistor provided between a second low-potential power node and the second memory node, gates of the second pull up transistor and the second pull down transistor being commonly connected to the first memory node;

a first pass gate transistor provided between a first bit line node and the first memory node; and a second pass gate transistor provided between a second bit line node and the second memory node, wherein the first and second pull up transistors, the first and second pull down transistors, and the first and second pass gate transistors are transistors with a fin structure, diffusion layer contacts corresponding to each of the first and second memory nodes, the first and second high-potential power nodes, the first and second low-potential power nodes, and the first and second bit line nodes, and a gate contact which commonly connects the gates of the first pull up transistor and the first pull down transistor to the second memory node and a gate contact which commonly connects the gates of the second pull up transistor and the second pull down transistor to the first memory node are formed on the contact layer, a first bit line and a second bit line are formed on the local metal interconnection layer, and the diffusion layer contacts which correspond to the first and second bit line nodes are connected through vias to the first and second bit lines respectively.

According to this aspect, the local metal interconnection layer which is thinner than the first metal interconnection layer is provided below the first metal interconnection layer, and the SRAM cell includes the transistor with the fin structure and the local metal interconnection layer. The memory nodes are electrically connected by the diffusion layer contacts and the gate contacts formed on the contact layer below the local metal interconnection layer. Further, the bit lines are formed on the local metal interconnection layer, and the diffusion layer contacts corresponding to the bit line nodes are connected through the vias to the bit lines. Therefore, since the local metal interconnection layer is thin, the parasitic capacitance of the bit lines is reduced, and the signal path from the pass gate transistors to the bit lines is simplified. As a result, the parasitic capacitance of the bit lines is even further reduced. Consequently, the parasitic capacitance of the bit lines is significantly reduced, which is why access performance of the SRAM cell is improved, and power consumption is reduced.

Thanks to the present disclosure, in an SRAM cell which employs a fin-type transistor, parasitic capacitance of bit lines is significantly reduced, which is why access performance of the SRAM cell is improved, and power consumption is reduced.

DETAILED DESCRIPTION

Embodiments will be described in detail with reference to the drawings.

Figure 1:
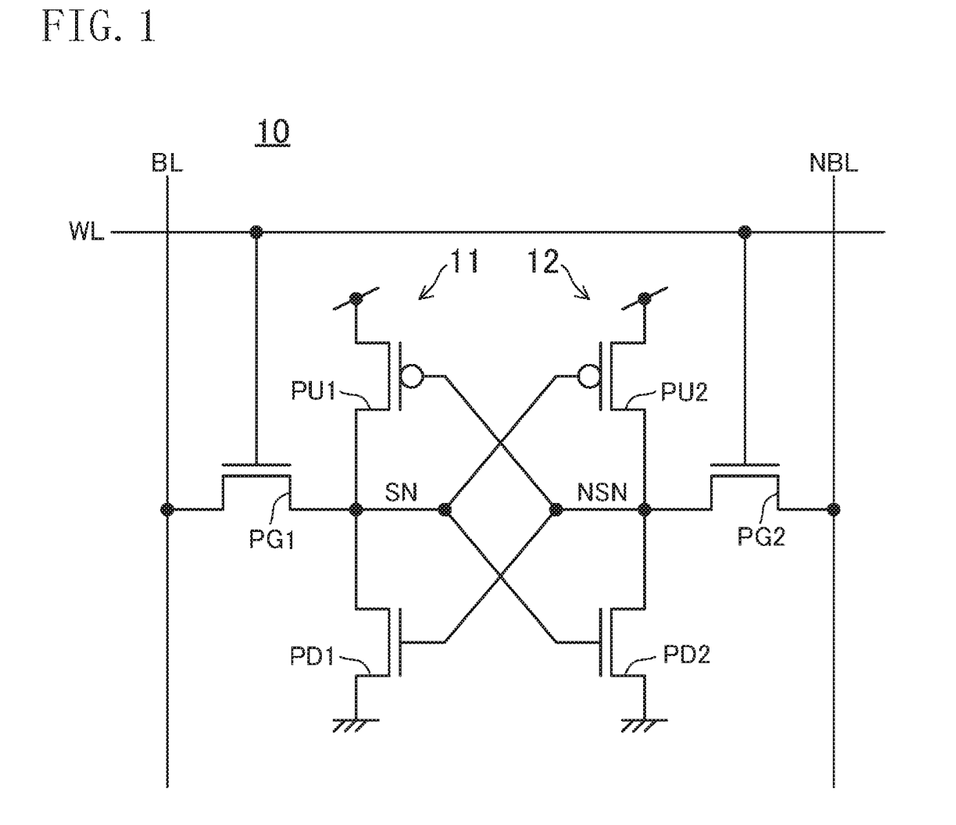
FIG. 1 is a circuit diagram showing a general structure of an SRAM cell.

FIG. 1 is a circuit diagram showing a general structure of an SRAM cell. An SRAM cell 10 shown in FIG. 1 includes transistors PU1, PU2, PD1, PD2, PG1, and PG2. The transistors PU1 and PU2 are pull up transistors which are PMOS transistors. The transistors PD1 and PD2 are pull down transistors which are NMOS transistors. The transistors PG1 and PG2 are pass gate transistors which are NMOS transistors.

In FIG. 1, a first inverter 11 has an output terminal connected to a first memory node SN, and an input terminal connected to a second memory node NSN. The first inverter 11 includes a first pull up transistor PU1 provided between a high-potential power node and the first memory node SN, and a first pull down transistor PD1 provided between a low-potential power node and the first memory node SN. The first pull up transistor PU1 and the first pull down transistor PD1 each have a gate. The gates are commonly connected to the second memory node NSN.

A second inverter 12 has an output terminal connected to the second memory node NSN, and an input terminal connected to the first memory node SN. The second inverter 12 includes a second pull up transistor PU2 provided between a high-potential power node and the second memory node NSN, and a second pull down transistor PD2 provided between a low-potential power node and the second memory node NSN. The second pull up transistor PU2 and the second pull down transistor PD2 each have a gate. The gates are commonly connected to the first memory node SN.

A first pass gate transistor PG1 is provided between a first bit line BL and the first memory node SN, and has a gate which is connected to a word line WL. A second pass gate transistor PG2 is provided between a second bit line NBL and the second memory node NSN, and has a gate which is connected to the word line WL.

In this embodiment, the six transistors PU1, PU2, PD1, PD2, PG1, and PG2 defining the SRAM cell 10 are transistors with a fin structure.

Figure 2:
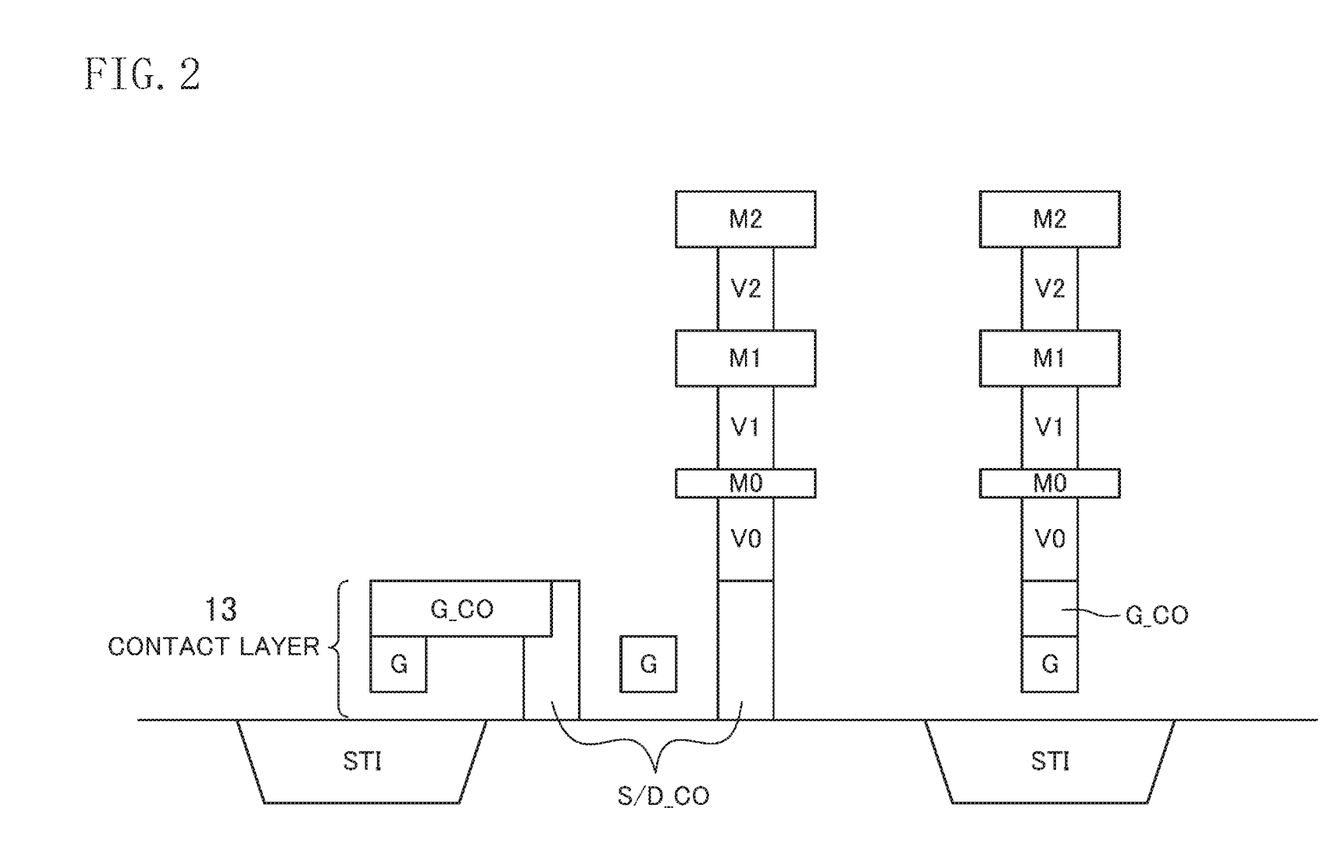
FIG. 2 schematically illustrates a layer structure of a semiconductor integrated circuit device according to an embodiment.

FIG. 2 schematically illustrates a layer structure of a semiconductor integrated circuit device according to an embodiment. Although FIG. 2 shows a cross-sectional structure of the semiconductor integrated circuit device, the drawing does not show cross-sectional structures of specific devices but schematically illustrates the layer structure employed in the present embodiment. In FIG. 2, G is a gate electrode, G_CO is a gate, S/D_CO is a diffusion layer contact, M0 is a local metal interconnection layer, M1 is a first metal interconnection layer, M2 is a second metal interconnection layer, and V0, V1, and V2 are vias. Note that in FIG. 2 a diffusion layer of the fin structure is not shown.

In the layer structure shown in FIG. 2, the local metal interconnection layer M0 is formed below the first and second metal interconnection layers M1 and M2, and is thinner than the first and second metal interconnection layers M1 and M2. Further, the local metal interconnection layer M0 is made from a material, e.g., a metal including tungsten, with a higher resistance than the first and second metal interconnection layers M1 and M2. The local metal interconnection layer M0 may be, for example, an interconnection layer according to a so-called local interconnection technique disclosed in Hiroshi Gotō, Process Module Technologies for Next Generation CMOS Logic LSIs, *FUJITSU* 49(2), March 1998 (p. 154, right row, third line from the top). This type of local interconnection is mainly employed in short distance interconnections, and is thin, which is why it has a low parasitic capacitance.

A contact layer 13 is formed below the local metal interconnection layer M0. The gate contact G_CO and the diffusion layer contact S/D_CO are formed on the contact layer 13. Note that structures of the gate contact G_CO and the diffusion layer contact S/D_CO are not limited to the structures shown in FIG. 2. Depending on, e.g., a manufacturing process, a number of structures is possible. For example, with respect to the gate contact G_CO and the diffusion layer contact S/D_CO, etching may be performed in the scope of a separate process, while embedding and planarization may be performed in the scope of the same process. In this case, the gate contact G_CO and the diffusion layer contact S/D_CO in a device processed this way are formed integrally.

Figure 3A:
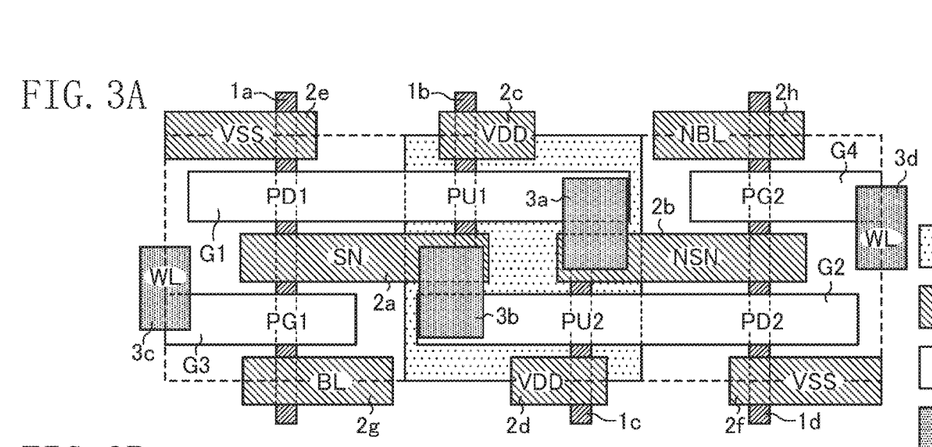
FIGS. 3A and 3B are plan views showing a layout structure of an SRAM cell according to an embodiment.
Figure 3B:
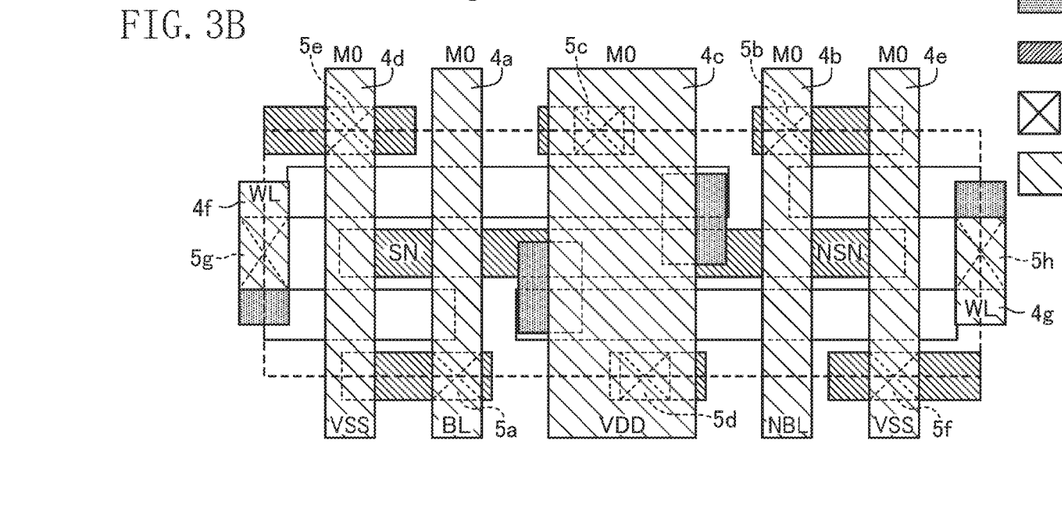
Figure 4A:
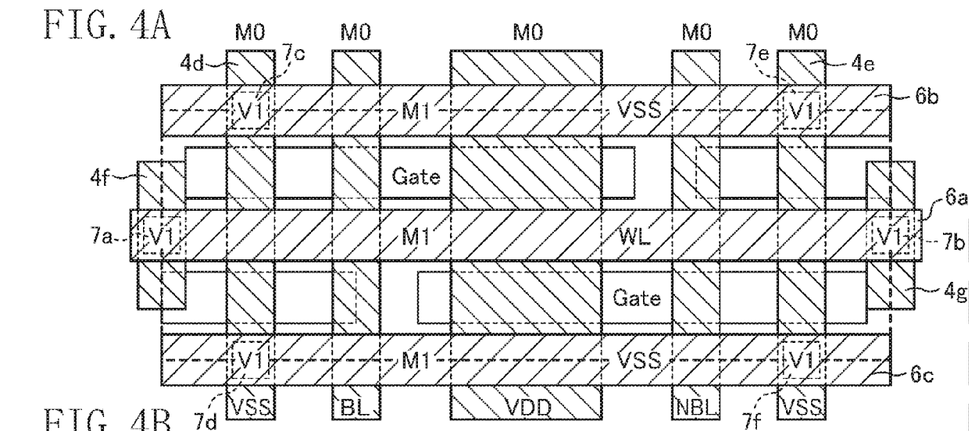
FIGS. 4A and 4B are plan views showing a layout structure of an SRAM cell according to an embodiment.
Figure 4B:
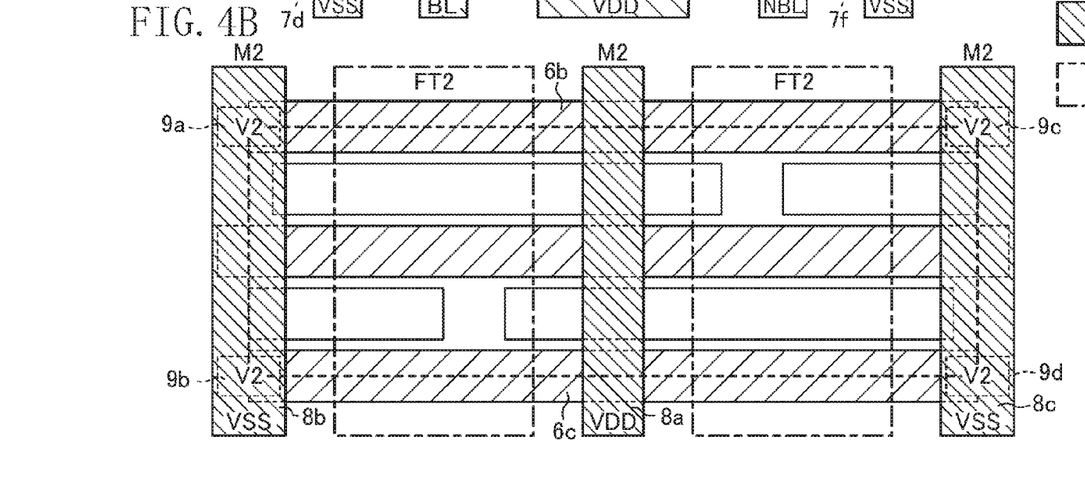

FIGS. 3 and 4 are plan views showing a layout structure of an SRAM cell according to an embodiment. FIGS. 3A, 3B, 4A, and 4B illustrate layers of the layout structure from bottom to top. The layout structure shown in FIGS. 3 and 4 is implemented by employing the layout structure shown in FIG. 2 in the SRAM cell 10 shown in FIG. 1.

First, as shown in FIG. 3A, fins 1a, 1b, 1c, and 1d which are part of the diffusion layer are arranged in parallel so as to extend in a vertical direction (corresponding to a first direction) in the drawing. Then, gate electrodes G1, G2, G3, and G4 are arranged so as to extend above the diffusion layer in a lateral direction (corresponding to a second direction) in the drawing. The gate electrode G1 is formed so as to pass through the fins 1a and 1b, and defines the transistors PD1 and PU1. The gate electrode G2 is formed so as to pass through the fins 1c and 1d, and defines the transistors PD2 and PU2. The gate electrode G3 is formed so as to pass through the fin 1a, and defines the transistor PG1. The gate electrode G4 is formed so as to pass through the fin 1d, and defines the transistor PG2.

Moreover, diffusion layer contacts 2a, 2b, 2c, 2d, 2e, 2f, 2g, and 2h are arranged above the diffusion layer. The diffusion layer contact 2a connects the fins 1a and 1b with each other, and corresponds to the first memory node SN. The diffusion layer contact 2b connects the fins 1c and 1d with each other, and corresponds to the second memory node NSN. The diffusion layer contacts 2c and 2d electrically connect the fins 1b and 1c to a power source VDD, and correspond to the high-potential power node. The diffusion layer contacts 2e and 2f electrically connect the fins 1a and 1d to a power source VSS, and correspond to the low-potential power node. The diffusion layer contact 2g connects the fin 1a to the first bit line BL, and corresponds to the first bit line node. The diffusion layer contact 2h connects the fin 1d to the second bit line NBL, and corresponds to the second bit line node.

Gate contacts 3a, 3b, 3c, and 3d are arranged above the gate electrode and the diffusion layer contact. The gate contact 3a connects the diffusion layer contact 2b and the gate electrode G1 with each other. More specifically, the gate contact 3a connects gates of the transistors PU1 and PD1 with the second memory node NSN. The gate contact 3b connects the diffusion layer contact 2a and the gate electrode G2 with each other. More specifically, the gate contact 3b connects gates of the transistors PU2 and PD2 with the first memory node SN. The gate contacts 3c and 3d connect the gate electrodes G3 and G4 with the word line WL.

Next, as shown in FIG. 3B, interconnections 4a, 4b, 4c, 4d, 4e, 4f, and 4g are arranged in parallel on the local metal interconnection layer M0 above the gate electrodes, the diffusion layer contacts, and the gate contacts so as to extend in the vertical direction in the drawing. The interconnection 4a is the first bit line BL, and the interconnection 4b is the second bit line NBL. The interconnection 4c is a VDD line (high-potential power line), and the interconnections 4d and 4e are VSS lines (low-potential power lines). The interconnections 4f and 4g are word lines WL.

Finally, vias (V0) 5a, 5b, 5c, 5d, 5e, 5f, 5g, and 5h are formed between (i) the local metal interconnection layer M0 and (ii) the gate electrodes, the diffusion layer contacts, and the gate contacts. The via 5a connects the diffusion layer contact 2g and the interconnection 4a with each other. The via 5b connects the diffusion layer contact 2h and the interconnection 4b with each other. The vias 5c and 5d connect the diffusion layer contacts 2c and 2d corresponding to the high-potential power node and the VDD line 4c with each other. The via 5e connects the diffusion layer contact 2e corresponding to the low-potential power node and the VSS line 4d with each other. The via 5f connects the diffusion layer contact 2f corresponding to the low-potential power node and the VSS line 4e with each other. The via 5g connects the gate contact 3c and the interconnection 4f with each other. The via 5h connects the gate contact 3d and the interconnection 4g with each other.

Next, as shown in FIG. 4A, interconnections 6a, 6b, and 6c are arranged in parallel on the first metal interconnection layer M1 above the local metal interconnection layer M0 so as to extend in the lateral direction (the second direction) in the drawing. The interconnection 6a is a word line WL. The interconnections 6b and 6c are VSS lines (second low-potential power lines). Further, vias (V1) 7a, 7b, 7c, 7d, 7e, and 7f are formed between the local metal interconnection layer M0 and the first metal interconnection layer M1. The vias 7a and 7b connect the interconnections 4f and 4g and the interconnection 6a (word line WL) with each other. More specifically, the gates of the transistors PG1 and PG2 are connected through the gate contacts 3c and 3d, the vias 5g and 5h, the interconnections 4f and 4g formed on the local metal interconnection layer M0, and the vias 7a and 7b to the word line WL. The vias 7c and 7d connect the VSS lines 6b and 6c and the VSS line 4d formed on the local metal interconnection layer M0 with each other. The vias 7e and 7f connect the VSS lines 6b and 6c and the VSS line 4e formed on the local metal interconnection layer M0 with each other.

Next, as shown in FIG. 4B, interconnections 8a, 8b, and 8c are arranged in parallel on the second metal interconnection layer M2 above the first metal interconnection layer M1 so as to extend in the vertical direction in the drawing. The interconnection 8a is a VDD line (second high-potential power line), and the interconnections 8b and 8c are VSS lines (third low-potential power lines). Further, vias (V2) 9a, 9b, 9c, and 9d are formed between the first metal interconnection layer M1 and the second metal interconnection layer M2. The vias 9a and 9b connect the VSS line 8b and the VSS lines 6b and 6c formed on the first metal interconnection layer M1 with each other. The vias 9c and 9d connect the VSS line 8c and the VSS lines 6b and 6c formed on the first metal interconnection layer M1 with each other. On the second metal interconnection layer M2, a feed-through area FT2 which is a free space and through which interconnections can freely pass is obtained.

The layout structure shown in FIGS. 3 and 4 has the following characteristics. The SRAM cell 10 is defined by the transistors PU1, PU2, PD1, PD2, PG1, and PG2 each of which has a fin structure, and by the local metal interconnection layer M0. As shown in FIG. 3A, the memory nodes SN and NSN are connected through the diffusion layer contacts and the gate contacts. As a result, the local metal interconnection layer M0 and the interconnection layer above the local metal interconnection layer M0 may be employed for other purposes.

Further, as shown in FIG. 3B, the first and second bit lines BL and NBL are formed on the local metal interconnection layer M0. The local metal interconnection layer M0 is thinner than the first and second metal interconnection layers M1 and M2, and therefore has a lower parasitic capacitance. Moreover, a signal path from the transistors through the vias to the first and second bit lines BL and NBL is simplified as compared to the case where the first and second bit lines BL and NBL are formed on the first metal interconnection layer M1 or above the first metal interconnection layer M1. As a result, the parasitic capacitance is even further reduced. Consequently, the parasitic capacitance of the first and second bit lines BL and NBL is significantly reduced, which is why access performance of the SRAM cell 10 is improved, and power consumption is reduced.

In addition, the VDD line 4c and the VSS lines 4d and 4e are arranged in parallel to the first and second bit lines BL and NBL on the local metal interconnection layer M0. Since the VDD line 4c and the VSS lines 4d and 4e act as shield wires of the first and second bit lines BL and NBL, operation of the SRAM cell 10 is stabilized.

As shown in FIG. 4A, the word line WL is formed on the first metal interconnection layer M1. Further, the VSS lines 6b and 6c are arranged in parallel to the word line WL on the first metal interconnection layer M1. Since the VSS lines 6b and 6c act as shield lines of the word line WL, operation of the SRAM cell 10 is stabilized. Moreover, together with the VSS lines 4d and 4e formed on the local metal interconnection layer M0, the VSS lines 6b and 6c form a mesh structure. As a result, power supply is stabilized.

Furthermore, as shown in FIG. 4B, the first and second bit lines BL and NBL do not have to be arranged on the second metal interconnection layer M2 and on the interconnection layer above the second metal interconnection layer M2, and do not have to be employed in the layout structure of the SRAM cell 10. Therefore, other signal interconnections and power lines can be arranged freely on the second metal interconnection layer M2 and on the interconnection layer above the second metal interconnection layer M2. As a result, the whole semiconductor integrated circuit device can be reduced in dimension and improved in performance. Note that, in the example shown in FIG. 4B, the feed-through area FT2 which is a free space is obtained in addition to the VSS line 8a and the VSS lines 8b and 8c arranged on the second metal interconnection layer M2.

Note that the interconnection 4c defined as a VDD line (high-potential power line) and the interconnection 8a defined as a VDD line (second high-potential power line) each have a VDD node. In order to supply the SRAM cell with high level potential, either one of the VDD nodes may not only be directly connected to an external power source, but may also be supplied with power from a power source through, for example, a power gating (power source cutoff) switch.

Figure 5:
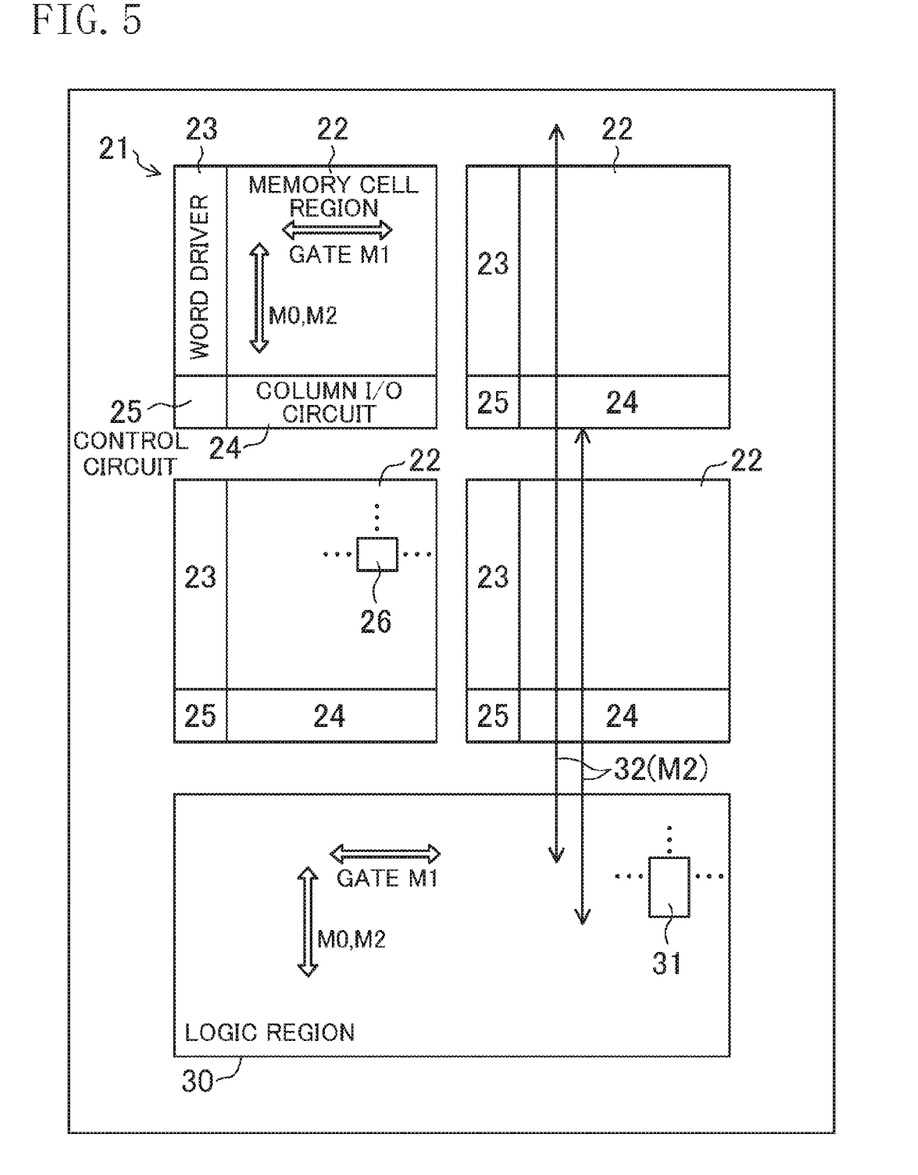
FIG. 5 illustrates a layout example of a semiconductor integrated circuit device provided with the SRAM cell shown in FIGS. 3 and 4.

FIG. 5 shows an example layout of a semiconductor integrated circuit device provided with the SRAM cell illustrated in FIGS. 3 and 4. The semiconductor integrated circuit device shown in FIG. 5 includes an SRAM region 21 in which SRAM cells 26 are arranged, and a logic region 30 in which standard cells 31 are arranged. In FIG. 5, the SRAM region 21 is divided into four regions. Each of the regions is provided with a memory cell region 22, a word driver 23, a column I/O circuit 24, and a control circuit 25. Note that, while not shown in the drawing, in the memory cell region 22 the SRAM cells 26 are arranged side by side in the vertical and lateral directions in the drawing, and in the logic region 30 the standard cells 31 are arranged side by side in the vertical and lateral directions in the drawing.

Figure 6A:
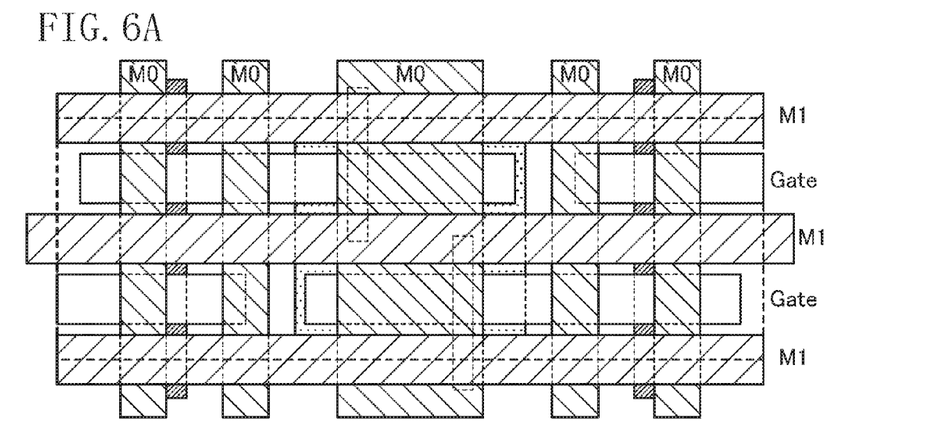
FIG. 6A illustrates a layout example of the SRAM cell of FIG. 5.
Figure 6B:
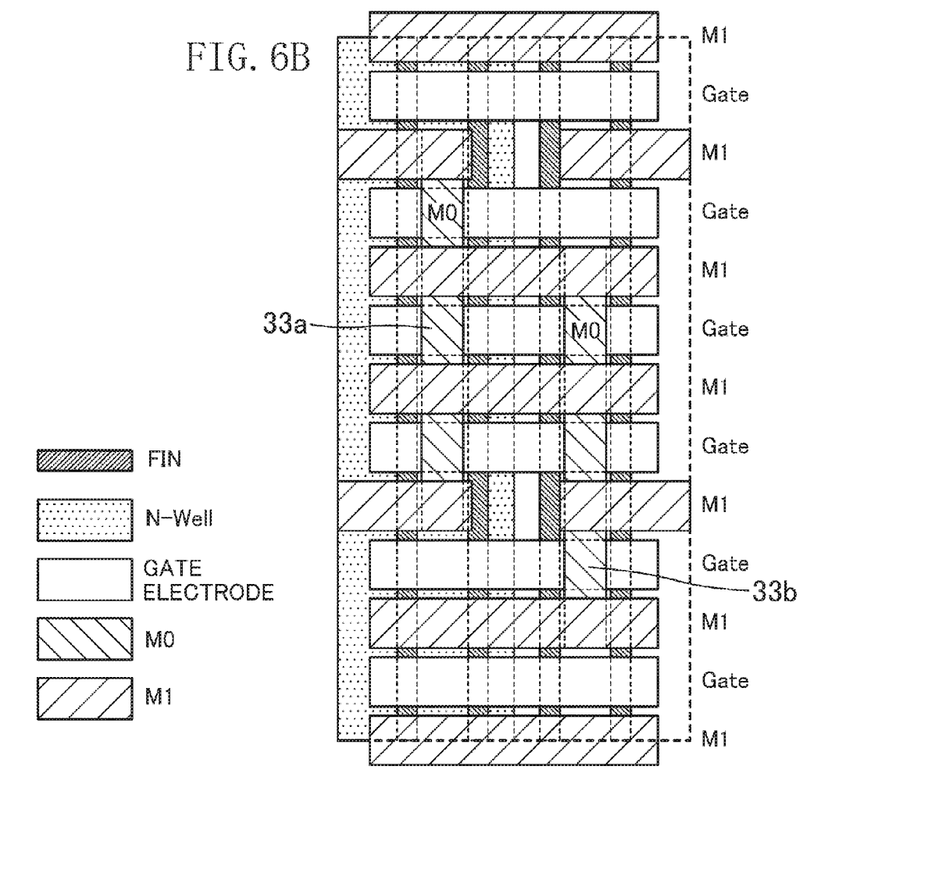
FIG. 6B illustrates a layout example of a standard cell of FIG. 5.

FIG. 6A illustrates a layout example of the SRAM cell 26 shown in FIG. 5, while FIG. 6B illustrates a layout example of the standard cell 31 shown in FIG. 5. FIGS. 6A and 6B illustrate the structure from its bottom until reaching the first metal interconnection layer M1. For the sake of simplicity, contacts and vias are omitted in the drawings. The layout shown in FIG. 6A is the same as the layout shown in FIGS. 3 and 4.

In the semiconductor integrated circuit device shown in FIG. 5, a signal interconnection 32 (indicated with arrows in FIG. 5) connected to the logic region 30 passes through a top portion of the SRAM region 21 in the second metal interconnection layer M2. Specifically, the signal interconnection 32 is arranged so as to pass through the feed-through area FT2 shown in FIG. 4B. As a result, an interconnect region in the SRAM cell 26 can be used effectively, which allows for reducing the semiconductor integrated circuit device in dimension.

Further, the SRAM cell 26 and the standard cell 31 have the same gate direction and the same interconnection direction in the interconnection layers M0, M1, and M2 (as indicated with white arrows in FIG. 5). In the semiconductor integrated circuit device, the gate direction and the interconnection direction are uniform, which allows for achieving a higher degree of precision in microfabrication processes. Moreover, adjusting the interconnection direction in the SRAM cells and that in the standard cells to be the same, makes interconnection layer transfer between SRAM regions and logic regions redundant. As a result, the SRAM regions and the logic regions can be arranged compactly in the semiconductor integrated circuit device.

Furthermore, as shown in FIG. 6B, in the standard cell 31, intra-cell interconnections 33a and 33b are formed on the local metal interconnection layer M0. As a result, interconnections can be arranged efficiently within the standard cell 31. This allows for miniaturizing the semiconductor integrated circuit device. Further, since the parasitic capacitance of the interconnections can be reduced, power consumption of the semiconductor integrated circuit device can be reduced. It is for example effective to use the local metal interconnection layer M0 as an internal interconnect of a flip flop. In addition, it becomes easy to use an upper interconnection layer of the standard cell 31, e.g., the interconnection layer M2, as an inter-cell interconnect.

As can be seen, according to the present embodiment, the local metal interconnection layer M0 which is thinner than the first metal interconnection layer M1 is provided below the first metal interconnection layer M1, and the SRAM cell 10 includes the transistors PU1, PU2, PD1, PD2, PG1, and PG2, which have a fin structure, and the local metal interconnection layer M0. The memory nodes SN and NSN are electrically connected by the diffusion layer contact S/D_CO and the gate contact G_CO which are formed on the contact layer 13 below the local metal interconnection layer M0. Further, the bit lines BL and NBL are formed on the local metal interconnection layer M0, and the diffusion layer contacts 2g and 2h corresponding to the bit line nodes are connected through the vias 5a and 5b to the bit lines BL and NBL. Therefore, since the local metal interconnection layer M0 is thin, the parasitic capacitance of the bit lines BL and NBL is reduced, and the signal path from the pass gate transistors PG1 and PG2 to the bit lines BL and NBL is simplified. As a result, the parasitic capacitance of the bit lines BL and NBL is even further reduced. Consequently, the parasitic capacitance of the bit lines BL and NBL is significantly reduced, which is why access performance of the SRAM cell is improved, and power consumption is reduced.

Thanks to the present disclosure, access performance of an SRAM cell which employs fin-type transistors can be improved, and power consumption can be reduced. This is effective for miniaturizing LSIs which come with, e.g., an SRAM, for improving performance, and for reducing power consumption.

What is claimed is:

1. A semiconductor integrated circuit device comprising:
at least one SRAM (static random access memory) cell;
a first metal interconnection layer formed as a first upper layer of the SRAM cell;
a second metal interconnection layer is formed above the first metal interconnection layer:
a local metal interconnection layer formed as a second upper layer of the SRAM cell and below the first metal interconnection layer, and being thinner than the first metal interconnection layer; and
a contact layer formed below the local metal interconnection layer,
the SRAM cell including:
a first inverter which has an output terminal connected to a first memory node and includes a first pull up transistor provided between a first high-potential power node and the first memory node, and a first pull down transistor provided between a first low-potential power node and the first memory node, gates of the first pull up transistor and the first pull down transistor being commonly connected to a second memory node;

a second inverter which has an output terminal connected to the second memory node and includes a second pull up transistor provided between a second high-potential power node and the second memory node, and a second pull down transistor provided between a second low-potential power node and the second memory node, gates of the second pull up transistor and the second pull down transistor being commonly connected to the first memory node;

a first pass gate transistor provided between a first bit line node and the first memory node; and a second pass gate transistor provided between a second bit line node and the second memory node, wherein the first and second pull up transistors, the first and second pull down transistors, and the first and second pass gate transistors are transistors with a fin structure, diffusion layer contacts corresponding to each of the first and second memory nodes, the first and second high-potential power nodes, the first and second low-potential power nodes, and the first and second bit line nodes, and a first gate contact which commonly connects the gates of the first pull up transistor and the first pull down transistor to the second memory node and a second gate contact which commonly connects the gates of the second pull up transistor and the second pull down transistor to the first memory node are formed on the contact layer, a first bit line and a second bit line are formed on the local metal interconnection layer, the diffusion layer contacts which correspond to the first and second bit line nodes are connected through vias to the first and second bit lines respectively, the first and second pull up transistors, the first and second pull down transistors, and the first and second pass gate transistors include fins which are arranged so as to extend in a first direction, the first and second bit lines are arranged in parallel so as to extend in the first direction, a word line is formed on the first metal interconnection layer so as to extend in a second direction which is vertical to the first direction when viewed in plane, gates of the first and second pass gate transistors are connected through a gate contact formed on the contact layer and an interconnect formed on the local metal interconnection layer to the word line, at least one among a second high-potential power line and a third low-potential power line is formed on the second metal interconnection layer so as to extend in the first direction, and a signal interconnection which is not electrically connected to the word line and the first and second bit lines passes through an upper portion of the SRAM cell on the second metal interconnection layer.

2. The semiconductor integrated circuit device of claim 1, wherein a high-potential power line is formed on the local metal interconnection layer so as to extend in the first direction, and the diffusion layer contacts which correspond to the first and second high-potential power nodes are connected through vias to the high-potential power line.

3. The semiconductor integrated circuit device of claim 2, wherein a low-potential power line is formed on the local metal interconnection layer so as to extend in the first direction, and the diffusion layer contacts which correspond to the first and second low-potential power node are connected through vias to the low-potential power line.

4. The semiconductor integrated circuit device of claim 1, wherein a second low-potential power line is formed on the first metal interconnection layer so as to extend in the second direction.

5. A semiconductor integrated circuit device comprising:
at least one SRAM (static random access memory) cell;
a first metal interconnection layer formed as a first upper layer of the SRAM cell;
a second metal interconnection layer is formed above the first metal interconnection layer;
a local metal interconnection layer formed as a second upper layer of the SRAM cell and below the first metal interconnection layer, and being thinner than the first metal interconnection layer; and
a contact layer formed below the local metal interconnection layer,
the SRAM cell including:
a first inverter which has an output terminal connected to a first memory node and includes a first pull up transistor provided between a first high-potential power node and the first memory node, and a first pull down transistor provided between a first low-potential power node and the first memory node, gates of the first pull up transistor and the first pull down transistor being commonly connected to a second memory node;
a second inverter which has an output terminal connected to the second memory node and includes a second pull up transistor provided between a second high-potential power node and the second memory node, and a second pull down transistor provided between a second low-potential power node and the second memory node, gates of the second pull up transistor and the second pull down transistor being commonly connected to the first memory node;
a first pass gate transistor provided between a first bit line node and the first memory node; and
a second pass gate transistor provided between a second bit line node and the second memory node, wherein
the first and second pull up transistors, the first and second pull down transistors, and the first and second pass gate transistors are transistors with a fin structure,
diffusion layer contacts corresponding to each of the first and second memory nodes, the first and second high-potential power nodes, the first and second low-potential power nodes, and the first and second bit line nodes, and a first gate contact which commonly connects the gates of the first pull up transistor and the first pull down transistor to the second memory node and a second gate contact which commonly connects the gates of the second pull up transistor and the second pull down transistor to the first memory node are formed on the contact layer,
a first bit line and a second bit line are formed on the local metal interconnection layer,
the diffusion layer contacts which correspond to the first and second bit line nodes are connected through vias to the first and second bit lines respectively, the first and second pull up transistors, the first and second pull down transistors, and the first and second pass gate transistors include fins which are arranged so as to extend in a first direction, the first and second bit lines are arranged in parallel so as to extend in the first direction, a word line is formed on the first metal interconnection layer so as to extend in a second direction which is vertical to the first direction when viewed in plane, and gates of the first and second pass gate transistors are connected through a gate contact formed on the contact layer and an interconnect formed on the local metal interconnection layer to the word line, the semiconductor integrated circuit device of further comprising:

an SRAM region in which the SRAM cell is arranged; and a logic region in which standard cells are arranged, wherein a part of a signal interconnection connected to the logic region passes through an upper portion of the SRAM region on the second metal interconnection layer.

6. The semiconductor integrated circuit device of claim 5, wherein in at least a part of the standard cells arranged in the logic region, interconnect direction in the first metal interconnection layer is the same as in the SRAM region.

7. The semiconductor integrated circuit device of claim 5, wherein at least a part of the standard cells arranged in the logic region includes an intra-cell interconnection formed on the local metal interconnection layer.

8. The semiconductor integrated circuit device of claim 5, wherein a high-potential power line is formed on the local metal interconnection layer so as to extend in the first direction, and the diffusion layer contacts which correspond to the first and second high-potential power nodes are connected through vias to the high-potential power line.

9. The semiconductor integrated circuit device of claim 5, wherein a low-potential power line is formed on the local metal interconnection layer so as to extend in the first direction, and the diffusion layer contacts which correspond to the first and second low-potential power node are connected through vias to the low-potential power line.

10. The semiconductor integrated circuit device of claim 5, wherein a second low-potential power line is formed on the first metal interconnection layer so as to extend in the second direction.

11. The semiconductor integrated circuit device of claim 5, wherein at least one among a second high-potential power line and a third low-potential power line is formed on the second metal interconnection layer so as to extend in the first direction.

* * * * *